(12) United States Patent
Yamashita

(10) Patent No.: US 10,439,551 B2
(45) Date of Patent: Oct. 8, 2019

(54) SOLAR CELL MODULE

(71) Applicant: KYOCERA CORPORATION, Kyoto (JP)

(72) Inventor: Mitsuo Yamashita, Higashiomi (JP)

(73) Assignee: KYOCERA CORPORATION, Kyoto (JP)

( * ) Notice: Subject to any disclaimer, the term of this patent is extended or adjusted under 35 U.S.C. 154(b) by 29 days.

(21) Appl. No.: 15/442,034

(22) Filed: Feb. 24, 2017

(65) Prior Publication Data

US 2017/0170779 A1 Jun. 15, 2017

Related U.S. Application Data

(63) Continuation of application No. PCT/JP2015/074232, filed on Aug. 27, 2015.

(30) Foreign Application Priority Data

Aug. 28, 2014 (JP) ................ 2014-174250

(51) Int. Cl.
*H02S 30/10* (2014.01)
*H01L 31/042* (2014.01)
(Continued)

(52) U.S. Cl.
CPC ........... *H02S 30/10* (2014.12); *H01L 31/042* (2013.01); *H01L 31/048* (2013.01); *H01L 31/049* (2014.12); *H01L 31/0488* (2013.01); *H02S 20/10* (2014.12); *H02S 20/30* (2014.12); *H02S 40/44* (2014.12); *F24S 25/13* (2018.05); *F24S 25/20* (2018.05); *Y02E 10/50* (2013.01)

(58) Field of Classification Search
None
See application file for complete search history.

(56) References Cited

U.S. PATENT DOCUMENTS 7,829,781 B2 * 11/2010 Montello ............. H01G 9/2027
136/244
2010/0059102 A1 3/2010 Yagiura et al.
(Continued)

FOREIGN PATENT DOCUMENTS

CN 101707909 A 5/2010
JP 2006-286838 10/2006
(Continued)

OTHER PUBLICATIONS

International Search Report in international application No. PCT/JP2015/074232, dated Oct. 20, 2015, in 1 page.
(Continued)

*Primary Examiner* — Tamir Ayad
(74) *Attorney, Agent, or Firm* — Duane Morris LLP (57) ABSTRACT

A solar cell module includes a solar cell panel and a first frame. The solar cell panel includes first and second substrates that are rectangular, and a photoelectric convertor. The first substrate includes a first extension portion and has: a first surface; a second surface on a back of the first surface; and a first A-side and a second A-side facing to each other. The second substrate has a third surface facing the second surface, a fourth surface on a back of the third surface, and a first B-side and a second B-side facing to each other. The photoelectric convertor is arranged between the second surface and the third surface. The first frame includes a first fixing portion that fixes an end of the first extension portion that extends more outside than the first B-side of the second substrate. The first fixing portion forms a groove with the second substrate.

10 Claims, 10 Drawing Sheets

(51) Int. Cl.
*H02S 20/10* (2014.01)
*H02S 20/30* (2014.01)
*H02S 40/44* (2014.01)
*H01L 31/048* (2014.01)
*H01L 31/049* (2014.01)
*F24S 25/13* (2018.01)
*F24S 25/20* (2018.01)

(56) References Cited

U.S. PATENT DOCUMENTS

2012/0234379 A1    9/2012  Takenaka
2014/0283911 A1*   9/2014  Tsujimoto ............... H02S 30/10
                                                            136/259

FOREIGN PATENT DOCUMENTS

JP    2008-288547    11/2008
JP    2011-114257     6/2011
JP    2013-153078     8/2013

OTHER PUBLICATIONS

Written Opinion of the International Searching Authority in international application No. PCT/JP2015/074232, dated Oct. 20, 2015, and Statement of Relevance of Non-English References Cited Therein, in 6 pages.
Official Action dated Feb. 7, 2018, in corresponding Chinese Patent Application No. 201580045479.3 with Statement of Relevance of Non-English References.

* cited by examiner

SOLAR CELL MODULE

CROSS-REFERENCE TO RELATED APPLICATIONS

The present application is a continuation based on PCT Application No. PCT/JP2015/074232 filed on Aug. 27, 2015, which claims the benefit of Japanese Application No. 2014-174250, filed on Aug. 28, 2014. PCT Application No. PCT/JP2015/074232 is entitled "SOLAR CELL MODULE", and Japanese Application No. 2014-174250 is entitled "SOLAR CELL MODULE". The contents of which are incorporated by reference herein in their entirety.

FIELD

Embodiments of the present disclosure relate generally to solar cell modules.

BACKGROUND

Solar cell modules require maintaining the power generation efficiency. One of the causes of decrease in the power generation efficiency of the solar cell modules is dirt. The power generation efficiency decreases when, for example, rainwater is evaporated on a light receiving surface made of glass of the solar cell modules and sand and dust contained in the rainwater is adhered to the light receiving surface and cuts off light. Under the circumstances, for example, a solar cell module with a notch on a frame thereof has been proposed.

SUMMARY

A solar cell module is disclosed. In one embodiment, a solar cell module is attached to a framework arranged on an installation surface, and includes a solar cell panel and a first frame. The solar cell panel includes first and second substrates, and a photoelectric convertor. The first substrate includes a first extension portion, is rectangular, and has: a first surface facing the installation surface; a second surface on a back of the first surface; and a first A-side and a second A-side facing to each other. The second substrate is rectangular and has: a third surface facing the second surface of the first substrate; a fourth surface on a back of the third surface; and a first B-side and a second B-side facing to each other. The photoelectric convertor is arranged between the second surface of the first substrate and the third surface of the second substrate. The first frame includes a first fixing portion. The first fixing portion fixes an end of the first extension portion of the first substrate that extends more outside than the first B-side of the second substrate. The first fixing portion of the first frame forms a groove with the second substrate.

DETAILED DESCRIPTION

A solar cell module according to each of Embodiments of the present disclosure will be described in detail with reference to the drawings.

Embodiment 1

Figure 1A:
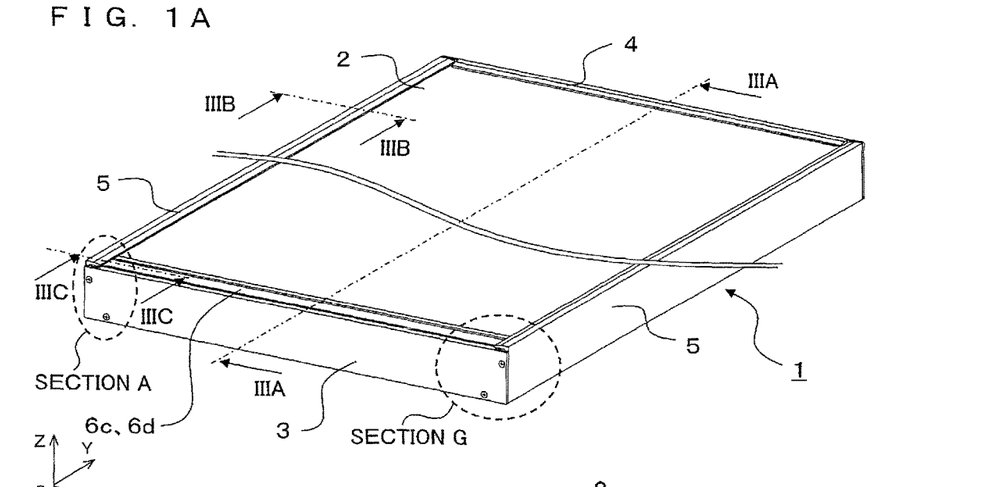
FIG. 1A is a perspective view of a solar cell module according to Embodiment 1 of the present disclosure.
Figure 1B:
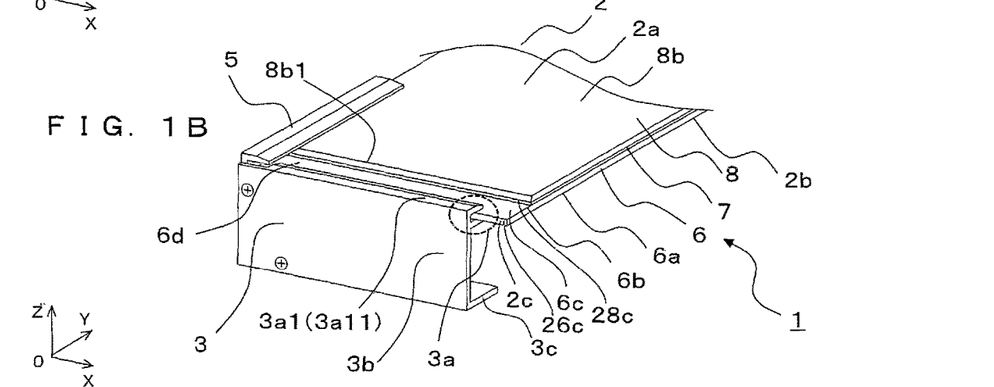
FIG. 1B is an enlarged perspective view of the solar cell module at a section A of FIG. 1A according to Embodiment 1 of the present disclosure.
Figure 1C:
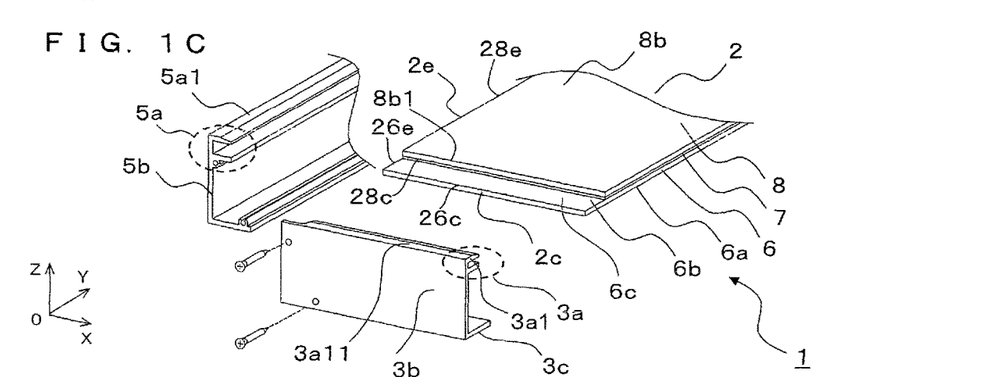
FIG. 1C is an exploded perspective view of the solar cell module in FIG. 1B according to Embodiment 1 of the present disclosure.
Figure 4:
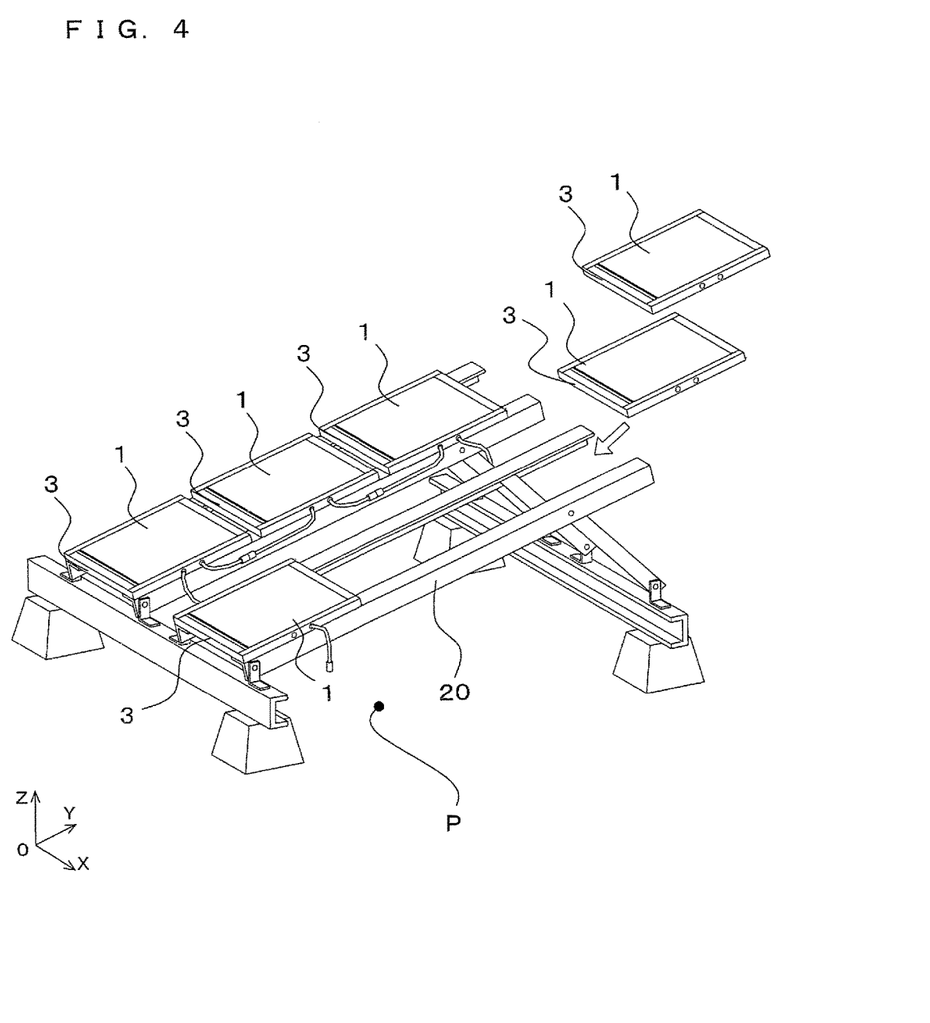
FIG. 4 is a perspective view of an example of solar cell modules of the present disclosure that are fixed to a framework arranged on an installation surface.

As illustrated in FIGS. 1A to 1C, a solar cell module 1 includes a solar cell panel 2, a first frame 3, a second frame 4, and third frames 5. Furthermore, the solar cell modules 1 are fixed to a framework 20 on an installation surface (ground) P as illustrated in FIG. 4.

The following description on the solar cell module 1 in FIGS. 1A to 1C may define a vertical direction (gravity direction) as a downward direction and a direction opposite to the gravity direction as an upward direction.

Furthermore, a direction along a longitudinal direction of the first frame 3 of the solar cell module 1 is defined as an X-axis direction, a direction orthogonal to the X-axis direction and parallel to the principal surface of the solar cell panel 2 is defined as a Y-axis direction, and a direction orthogonal to the X-axis and Y-axis directions is defined as a Z-axis direction in each of the drawings. Furthermore, examples of the X-axis direction include a +X direction directing from the back to the front of the paper of FIG. 1A, and a −X direction opposite to the +X direction. Examples of the Y-axis direction include a +Y direction directing from the first flame 3 to the second frame 4, and a −Y direction opposite to the +Y direction. Examples of the Z-axis direction include a −Z direction directing the gravity direction, and a +Z direction opposite to the −Z direction.

Figure 2A:
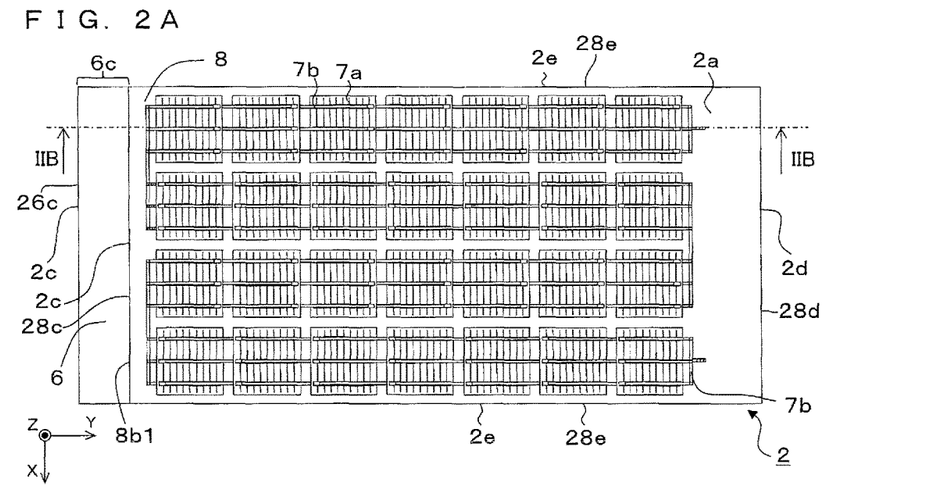
FIG. 2A is a plan view of a solar cell panel for the solar cell module according to Embodiment 1 of the present disclosure when seen from the front surface.
Figure 2B:
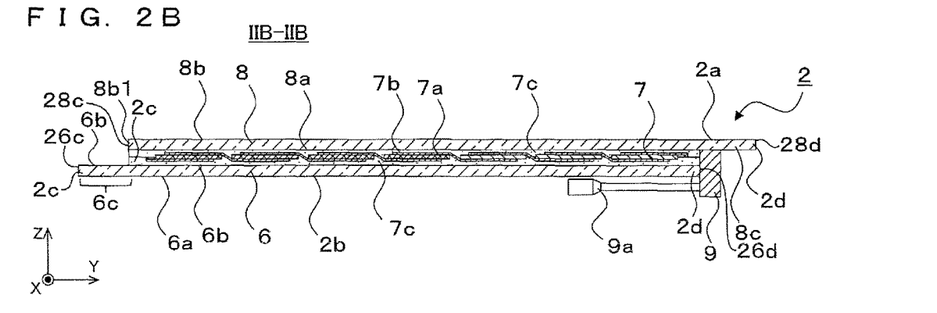
FIG. 2B is a cross-section view of the solar cell panel for the solar cell module according to Embodiment 1 of the present disclosure that is taken from line IIB-IIB of FIG. 2A.
Figure 2C:
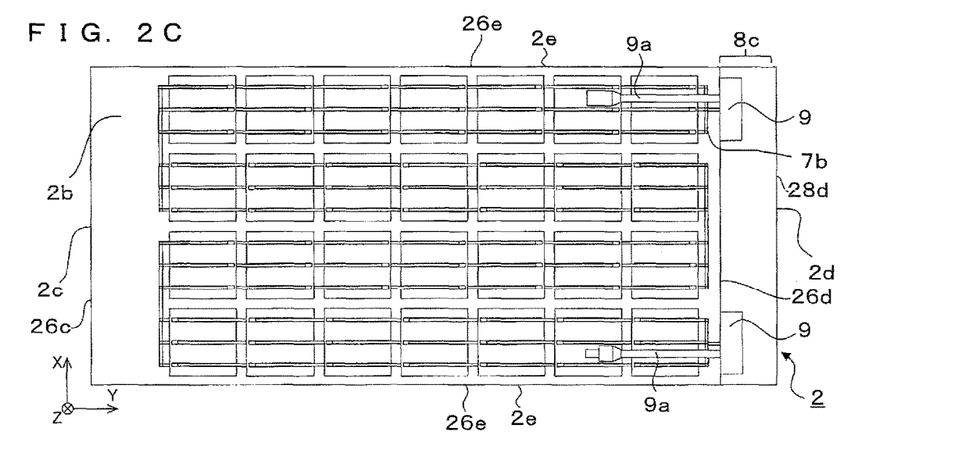
FIG. 2C is a bottom view of the solar cell panel for the solar cell module according to Embodiment 1 of the present disclosure when seen from the back.

As illustrated in FIGS. 2A to 2C, the solar cell panel 2 has a front surface 2a that is upward (in the +Z direction), and a back surface 2b corresponding to the back of this front surface 2a.

The solar cell panel 2 includes a first substrate 6, a photoelectric convertor 7, and a second substrate 8 that are laminated in an order from the back surface 2b.

The first substrate 6 and the second substrate 8 are rectangular components for protecting the photoelectric convertor 7. The first substrate 6 and the second substrate 8 can be made of, for example, reinforced glass or super white glass.

The first substrate 6 has a first surface 6a closer to the back surface 2b of the solar cell panel 2, and a second surface 6b that is a back of the first surface 6a. Furthermore, the first substrate 6 has a first A-side (also referred to as first primary side) 26c, and a second Aside (also referred to as second primary side) 26d that are facing to each other. The solar cell panel 2 is arranged so that the first surface 6a of the first substrate 6 faces the installation surface P. Furthermore, the second surface 6b of the first substrate 6 is in contact with the photoelectric convertor 7. Furthermore, the first substrate 6 includes a first extension portion 6c that extends more outside (in the −Y direction) than the second substrate 8 at one of the sides of the solar cell panel 2 in a plan view from the first surface 6a. In other words, the first extension portion 6c is a portion of the first substrate 6 that extends more outside than a first B-side (also referred to as first secondary side) 28c of the second substrate 8 to be described later. The photoelectric convertor 7 is not arranged on the second surface 6b of the first extension portion 6c. In other words, the photoelectric convertor 7 is located inside the second substrate 8 on the first extension portion 6c side in a plan view of the solar cell panel 2 from the second surface 6b. The following description defines, among the sides of the solar cell panel 2, a side closer to the first extension portion 6c as a first side 2c, a side opposed to the first side 2c as a second side 2d, and two sides connecting the first side 2c and the second side 2d as third sides 2e. Furthermore, the third sides 2e of the solar cell panel 2 includes third A-sides (also referred to as third primary sides) 26e of the first substrate 6, and third B-sides 28e of the second substrate 8 to be described later. In other words, the third A-sides 26e are between the first A-side 26c and the second A-side 26d, and are two sides connecting the first A-side 26c and the second A-side 26d.

The second substrate 8 is arranged to sandwich the photoelectric convertor 7 with the first substrate 6. The second substrate 8 has a third surface 8a facing the second surface 6b of the first substrate 6, and a fourth surface 8b that is a back of this third surface 8a. The third surface 8a of the second substrate 8 is in contact with the photoelectric convertor 7. The fourth surface 8b of the second substrate 8 is a part of the front surface 2a of the solar cell panel 2. Furthermore, the second substrate 8 has a first B-side 28c and a second B-side (also referred to as second secondary side) 28d that are facing to each other. The second substrate 8 does not cover the first extension portion 6c of the first substrate 6. The end of the fourth surface 8b closer to the first extension portion 6c is defined as a first end 8b1. Furthermore, the second substrate 8 includes a second extension portion 8c that extends more outside than the second A-side 26d of the first substrate 6, in the vicinity of the second side 2d of the solar cell panel 2 in a plan view from the fourth surface 8b. The photoelectric convertor 7 is not arranged under the second extension portion 8c with respect to the third surface 8a (−Z direction). The ends of the first substrate 6 (ends included in the third A-sides 26e) are flush with the ends of the second substrate 8 (ends included in the third B-sides 28e) at the third sides 2e of the solar cell panel 2. In other words, the third A-sides 26e of the first substrate 6 and the third B-sides (also referred to as third secondary sides) 28e of the second substrate 8 overlap one another in the solar cell panel 2. To put it differently, the third B-sides 28e are between the first B-side 28c and the second B-side 28d, and two sides connecting the first B-side 28c and the second B-side 28d.

The first extension portion 6c and the second extension portion 8c can be formed by, for example, overlaying the first substrate 6 and the second substrate 8 of different sizes. Furthermore, the first extension portion 6c of the first substrate 6 and the second extension portion 8c of the second substrate 8 may be formed by arranging substrates of the same size with displacement in the Y-axis direction. Accordingly, since the first substrate 6 and the second substrate 8 can be formed with the same shape and made of the same material in the solar cell panel 2, commonality of components can be provided. As a result, the productivity can be increased.

The photoelectric convertor 7 includes solar cells 7a, lead portions 7b, and a sealing material 7c. Specifically, the solar cells 7a are electrically connected via the lead portions 7b and sealed by the sealing material 7c in the photoelectric convertor 7. As such, the photoelectric convertor 7 is electrically connected to the lead portions 7b. Furthermore, some of the lead portions 7b extend more outside than the photoelectric convertor 7 at the second extension portion 8c side, and are housed in boxes 9 to be described later.

The solar cells 7a have a function of converting incident light into electricity. Such solar cells 7a each include, for example, a substrate made of a single crystal silicon or a polycrystalline silicon, and electrodes located on a front surface (upper surface) and a back surface (undersurface) of this substrate. The solar cells 7a each including a single crystal silicon substrate or a polycrystalline silicon substrate is rectangle. Here, one side of each of the solar cells 7a may be, for example, 100 to 200 mm long. Among the solar cells 7a each including a silicon substrate, for example, an electrode on one of the adjacent solar cells 7a is electrically connected to an electrode on a back surface of the other adjacent solar cell 7a via the lead portion 7b. Accordingly, the solar cells 7a are arranged to be connected in series.

The solar cells 7a may be of any kind. The solar cells 7a may be, for example, thin-film solar cells made of a material such as amorphous silicon, copper indium gallium selenide (CIGS), or cadmium telluride (CdTe). In such thin-film solar cell panel 2, adjacent solar cells are sometimes electrically connected via a transparent electrode instead of the lead portion 7b. Furthermore, the solar cells 7a may be solar cells each obtained by forming a thin film made of amorphous silicon on a single crystal silicon substrate or a polycrystalline silicon substrate.

The lead portions 7b have a function of electrically connecting the adjacent solar cells 7a. Examples of such lead portions 7b include copper foil covered with a solder to be connected to the solar cells 7a.

The sealing material 7c has a function of sealing, for example, the solar cells 7a and the lead portions 7b. Examples of such sealing material 7c include a thermosetting resin such as transparent ethylene-vinyl acetate (EVA) copolymer.

As illustrated in FIGS. 2B and 2C, the boxes 9 are attached to the solar cell panel 2. The boxes 9 are resin cases each including a terminal (not illustrated). The lead portions 7b that extend from a portion between the first substrate 6 and the second substrate 8 are housed in the boxes 9 and connected to the terminals therein. Furthermore, each of the terminals is connected to a cable 9a that outputs the power generated by the solar cell panel 2 through the lead portion 7b and the terminal. Furthermore, even when the photoelectric convertor 7 includes the thin-film solar cells 7a, the lead portions 7b for leading to the boxes 9 are electrically connected to the photoelectric convertor 7.

As illustrated in FIGS. 1A to 1C and 3A to 3C, the solar cell module 1 includes the first frame 3, the second frame 4, and the third frames 5 that hold an outer edge of the solar cell panel 2.

The first frame 3 includes a first holder 3a into which the first extension portion 6c of the first substrate 6 fits. This first holder 3a corresponds to a first fixing portion that fixes the solar cell panel 2 at the end of the first extension portion 6c. Accordingly, the first frame 3 can hold the first substrate 6 (solar cell panel 2) at the first side 2c of the solar cell panel 2. This first holder 3a has an opening with a width approximately identical to the thickness of the first substrate 6.

Furthermore, the first frame 3 includes a first side surface portion 3b extending from the first holder 3a toward the installation surface P in a direction vertical to the back surface 2b of the solar cell panel 2. As illustrated in FIGS. 3A to 3C and 4, this first side surface portion 3b corresponds to a first supporting portion between the first holder 3a and the framework 20. Furthermore, the first frame 3 includes a first bottom portion 3c protruding from a lower portion of the first side surface portion 3b inside the solar cell module 1 in a direction vertical to the first side surface portion 3b. This first bottom portion 3c corresponds to a first protruding portion protruding along the framework 20. Here, the lower surface of the first bottom portion 3c is defined as a first lower surface 3c1. The first side surface portion 3b may be extended not limited to at an angle perpendicular to the installation surface P but also in a diagonal direction with respect to the installation surface P. Furthermore, the first bottom portion 3c is not limited to a plate but may be a part of a hollow portion in the first frame 3. The first holder 3a includes a first portion 3a1 that extends from the first side surface portion 3b and covers the second surface 6b of the first extension portion 6c. The first portion 3a1 includes a first upper portion 3a11 that is an upper surface thereof (in the +Z direction).

Figure 3A:
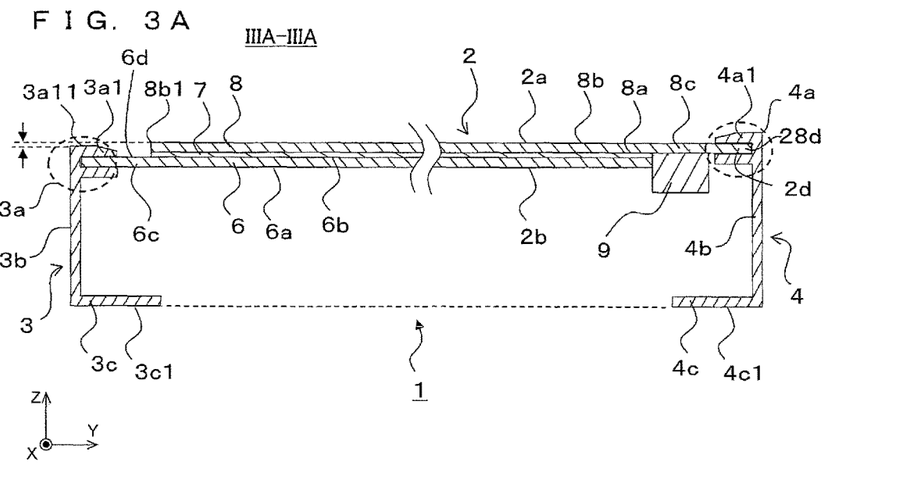
FIG. 3A is a cross-section view of the solar cell module according to Embodiment 1 of the present disclosure that is taken from line IIIA-IIIA of FIG. 1A.

As illustrated in FIG. 3A, the second frame 4 includes a second holder 4a into which the second extension portion 8c of the second substrate 8 fits. This second holder 4a corresponds to a second fixing portion that fixes the solar cell panel 2 at the end of the second extension portion 8c. Accordingly, the second frame 4 can hold the second substrate 8 (solar cell panel 2) at the second side 2d of the solar cell panel 2. This second holder 4a has an opening with a width approximately identical to the thickness of the second substrate 8.

Furthermore, as illustrated in FIG. 3A, the second frame 4 includes a second side surface portion 4b extending from the second holder 4a toward the installation surface P in a direction vertical to the back surface 2b of the solar cell panel 2. As illustrated in FIGS. 3A to 3C and 4, this second side surface portion 4b corresponds to a second supporting portion between the second holder 4a and the framework 20. Furthermore, the second frame 4 includes a second bottom portion 4c that is inverted L-shaped and protrudes inside the solar cell module 1 in a direction vertical to the second side surface portion 4b from a lower portion of the second side surface portion 4b (−Y direction). This second bottom portion 4c corresponds to a second protruding portion protruding along the framework 20. Here, the lower surface of the second bottom portion 4c is defined as a second lower surface 4c1. Furthermore, the second holder 4a includes a second portion 4a1 that extends from the second side surface portion 4b and covers the fourth surface 8b of the second extension portion 8c.

Furthermore, the second holder 4a of the second frame 4 does not have to hold the entire second extension portion 8c. The second holder 4a may hold, for example, only the end of the second extension portion 8c in the +Y direction. Accordingly, the solar cell module 1 has a space between the second frame 4 and the end of the first substrate 6 in the +Y direction. The boxes 9 housing the lead portions 7b electrically connected in the photoelectric convertor 7 may be arranged on the third surface 8a of the second extension portion 8c facing this space. Since such a structure allows the lead portions 7b to be led from a portion between the first substrate 6 and the second substrate 8, the lead portions 7b do not have to be led by opening holes in the first substrate 6. Accordingly, decrease in the strength of the first substrate 6 can be reduced.

Figure 3B:
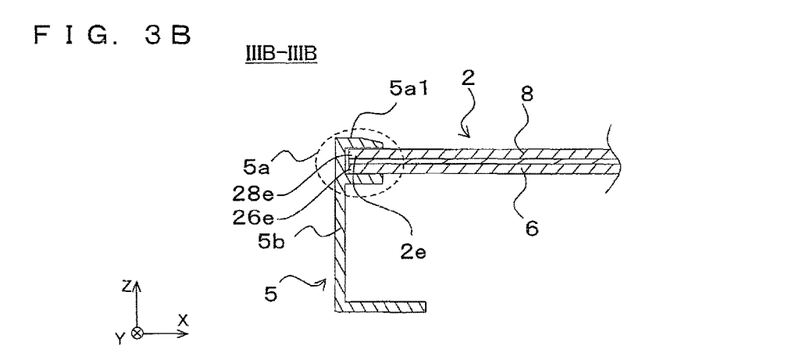
FIG. 3B is a cross-section view of the solar cell module according to Embodiment 1 of the present disclosure that is taken from line IIIB-IIIB of FIG. 1A.
Figure 3C:
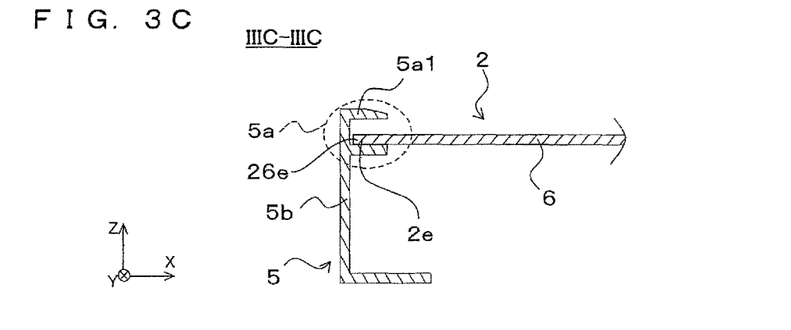
FIG. 3C is a cross-section view of the solar cell module according to Embodiment 1 of the present disclosure that is taken from line IIIC-IIIC of FIG. 1A.

As illustrated in FIG. 3B, the third frame 5 includes a third holder 5a into which a side of the first substrate 6 (specifically third A-side 26e) and a side of the second substrate 8 (specifically third B-side 28e), that are located at the third side 2e of the solar cell panel 2, simultaneously fit. This third holder 5a corresponds to a third fixing portion that fixes the solar cell panel 2 by the third A-side 26e of the first substrate 6 and the third B-side 28e of the second substrate 8. Accordingly, the third frame 5 can hold the solar cell panel 2 at the third side 2e of the solar cell panel 2. This third holder 5a has an opening with a width approximately identical to a combined thickness of the first substrate 6, the photoelectric convertor 7, and the second substrate 8. Furthermore, the third frame 5 includes a third portion 5a1 that covers a part of the fourth surface 8b as a part of the third holder 5a, and a third side surface portion 5b that is continuous from the third portion 5a1, extends along a portion from the end of the first extension portion 6c that is included in the first A-side 26c to the end of the second extension portion 8c that is included in the second B-side 28d, and covers the side surfaces of the first substrate 6 and the second substrate 8. This third side surface portion 5b corresponds to a third supporting portion between the third holder 5a and the framework 20. As illustrated in FIG. 3C, only the first substrate 6 is inserted into the third holder 5a at the first extension portion 6c in the third side 2e of the solar cell panel 2. On the other hand, only the second substrate 8 is inserted into the third holder 5a at the second extension portion 8c in the third side 2e of the solar cell panel 2.

Each of the first frame 3, the second frame 4, and the third frames 5 can be, for example, a long length component whose cross section is approximately L-shaped. Furthermore, these components can be formed by, for example, extrusion molding of an aluminum alloy.

As illustrated in FIG. 4, the solar cell modules 1 are attached to, for example, the framework 20 installed on the installation surface. Accordingly, the solar cell modules 1 are fixed to the installation surface (ground) P. When the solar cell modules 1 are installed at an inclination, each of the first frames 3 may be placed lower with respect to the inclination direction (in the −Y direction in FIG. 4). The solar cell modules 1 are installed not only at an inclination but may be attached to the framework 20 so that each of the surfaces 2a thereof is approximately horizontal. As such, the solar cell modules 1 attached to the framework 20 are called a solar cell array.

In the solar cell module 1 according to Embodiment 1, the first frame 3 holds the first extension portion 6c of the first substrate 6 that extends more outside than the second substrate 8. Accordingly, the fourth surface 8b of the second substrate 8 is upper than the second surface 6b of the first substrate 6 with respect to the first extension portion 6c in the vertical direction. Thus, the first extension portion 6c is lower than the first end 8b1 of the second substrate 8. Accordingly, the rainwater including sand and dust that builds up on the fourth surface 8b of the second substrate 8 is easily drained across the entire first end 8b1 (entire length along the +X direction in FIG. 2A) to the first extension portion 6c of the first substrate 6 that is placed lower according to Embodiment 1. As a result, the rainwater hardly remains on the fourth surface 8b of the second substrate 8. Thus, dirt caused by evaporation of the rainwater on the fourth surface 8b of the second substrate 8 can be reduced according to Embodiment 1. Accordingly, since decrease in the light transmittance of the solar cell panel 2 can be reduced, the power generation efficiency can be maintained according to Embodiment 1.

Furthermore, as illustrated in FIG. 3A, the first holder 3a fixes the first extension portion 6c, and the second holder 4a fixes the second extension portion 8c in the solar cell module 1 according to Embodiment 1. Accordingly, substrates of the same size can be used as the first substrate 6 and the second substrate 8.

As illustrated in FIGS. 1A to 1C and 3A, a groove 6d may be located between the first portion 3a1 of the first frame 3 and the second substrate 8. Accordingly, the rainwater and others that flow through the fourth surface 8b of the second substrate 8 is drained to the groove 6d. Thus, when the rainwater is evaporated and sand and dust are adhered to the groove 6d, since the photoelectric convertor 7 is not arranged at the first extension portion 6c, the power generation efficiency hardly decreases. Furthermore, the rainwater and others that build up in the groove 6d first flows to the lower side including the first frame 3 (in the −Y direction) more easily than to the fourth surface 8b of the second substrate 8. The groove 6d is provided so that a distance between the first holder 3a and the first end 8b1 in the Y-axis direction may be 1.5 to 35 mm long if the first extension portion 6c is 10 to 45 mm long in the Y-axis direction. A filler such as a silicone thinner than the second substrate 8 may be filled in the groove 6d in the thickness direction (±Z direction) of the second substrate 8.

As illustrated in FIG. 3A, an upper portion (first upper portion 3a11) of the first portion 3a1 of the first frame 3 may be lower than an end (first end 8b1) of the fourth surface 8b of the second substrate 8 closer to the first extension portion 6c in a laminating direction (Z-axis direction) of the first substrate 6 and the second substrate 8 according to Embodiment 1. In other words, a level of a surface of the first portion 3a1 that is opposite to the second surface 6b is between a level of the second surface 6b of the first extension portion 6c and a level of the fourth surface 8b at the first B-side 28c of the second substrate 8. Thus, the first portion 3a1 may be thinner than a total thickness of the second substrate 8 and the photoelectric convertor 7 in the laminating direction (Z-axis direction) of the first substrate 6 and the second substrate 8.

Accordingly, the rainwater and others falling on the fourth surface 8b of the second substrate 8 and the first extension portion 6c of the first substrate 6 are more easily drained outside the solar cell module 1 according to Embodiment 1. Thus, the rainwater hardly builds up not only on the fourth surface 8b of the second substrate 8 but also on the first substrate 6 (second surface 6b of the first extension portion 6c) according to Embodiment 1. As a result, since the dirt caused by evaporation of the rainwater on the second substrate 8 can be further reduced, the power generation efficiency is more easily maintained according to Embodiment 1.

As illustrated in FIG. 3A, the first lower surface 3c1 of the first frame 3 may be flush with the second lower surface 4c1 of the second frame 4 according to Embodiment 1. In other words, a surface of the first bottom portion 3c (first protruding portion) closer to the framework 20 is flush with a surface of the second bottom portion 4c (second protruding portion) closer to the framework 20. Embodiment 1 can be easily achieved by lengthening the second side surface portion 4b more than the first side surface portion 3b by the thicknesses of the photoelectric convertor 7 and the second substrate 8. As illustrated in, for example, FIG. 4, since the surface of the framework 20 on which the solar cell modules 1 are supported can be flush according to Embodiment 1, the workability of the solar cell modules 1 is improved.

Furthermore, as illustrated in FIG. 4, when the solar cell modules 1 are arranged by inclining the first frames 3 downward on the framework 20, the first ends 8b1 of the second substrates 8 may be higher in the +Z direction than the first upper portions 3a11 of the first frames 3.

Embodiment 2

Figure 5A:
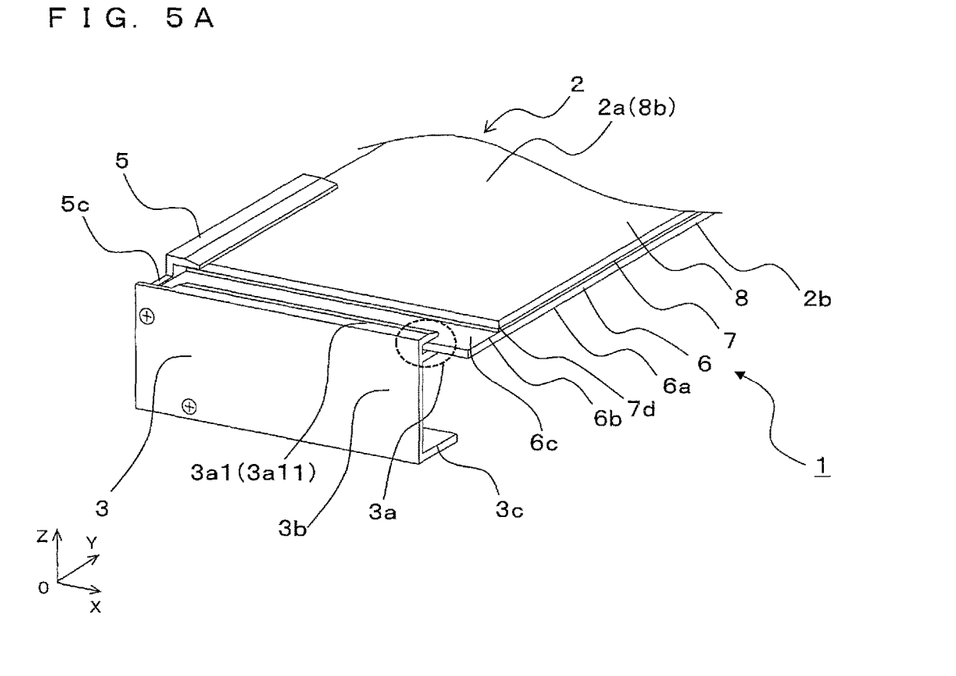
FIG. 5A is an enlarged perspective view of a solar cell module according to Embodiment 2 of the present disclosure that corresponds to the section A of FIG. 1A.
Figure 5B:
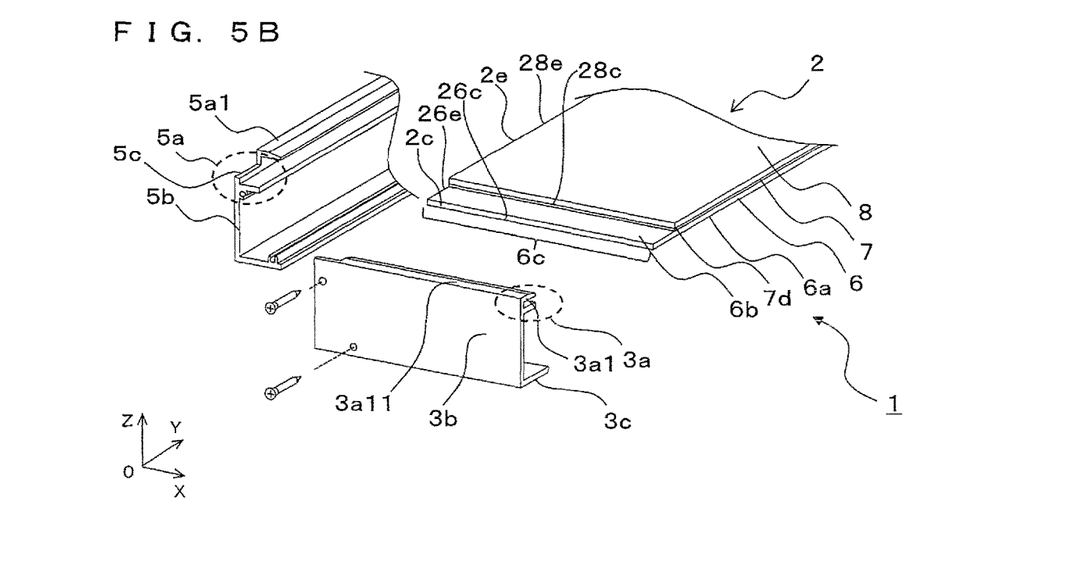
FIG. 5B is an exploded perspective view of the solar cell module in FIG. 5A according to Embodiment 2 of the present disclosure.

As illustrated in FIGS. 5A and 5B, Embodiment 2 differs from Embodiment 1 in structure of the third side surface portion 5b of the third frame 5 at the third A-side 26e (side surface portion) of the first extension portion 6c. Specifically, the third frame 5 includes at a part of the third side surface portion 5b, a drain outlet 5c whose height in the laminating direction (Z-axis direction) of the first substrate 6 and the second substrate 8 is lower than or equal to a height of the second surface 6b of first extension portion 6c in the first substrate 6 according to Embodiment 2. In other words, the third side surface portion 5b of the third frame 5 has the drain outlet 5c with a groove shape in Embodiment 2. The drain outlet 5c can be formed by, for example, notching a part of the third side surface portion 5b at the end of the third frame 5. Furthermore, such drain outlet 5c corresponds to a notch formed in the third portion 5a1 and the third side surface portion 5b that are located along the end of the first extension portion 6c to reach a portion flush with the second surface 6b of the first extension portion 6c from a portion closer to the fourth surface 8b.

Accordingly, the rainwater and others falling on the first extension portion 6c of the first substrate 6 through the second substrate 8 pass through the drain outlet 5c, and are drained outside the solar cell module 1 according to Embodiment 2. Specifically, the rainwater and others falling on the first extension portion 6c flow in the −X direction and are drained outside from the drain outlet 5c in FIG. 5A. Thus, the sealing material 7c at a second end 7d that is an end of the photoelectric convertor 7 closer to the first extension portion 6c is hardly in contact with the rainwater that builds up on the first extension portion 6c. Accordingly, since the moisture absorbed by the sealing material 7c can be reduced, degradation of the photoelectric convertor 7 caused by yellowing of the sealing material 7c or acids yielded by hydrolysis thereof can be reduced according to Embodiment 2. As a result, decrease in the power generation efficiency subject to the degradation can be reduced according to Embodiment 2. Furthermore, it is possible to reduce the rainwater that excessively builds up on the groove 6d flowing to the fourth surface 8b of the second substrate 8.

Figure 6A:
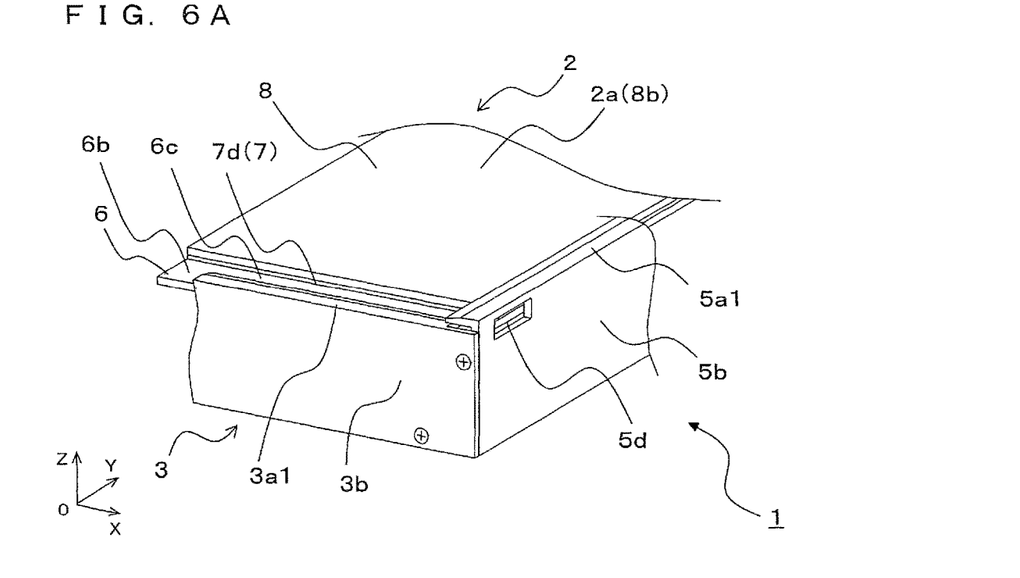
FIG. 6A is an enlarged perspective view of the solar cell module according to Embodiment 2 of the present disclosure that corresponds to a section G of FIG. 1A.
Figure 6B:
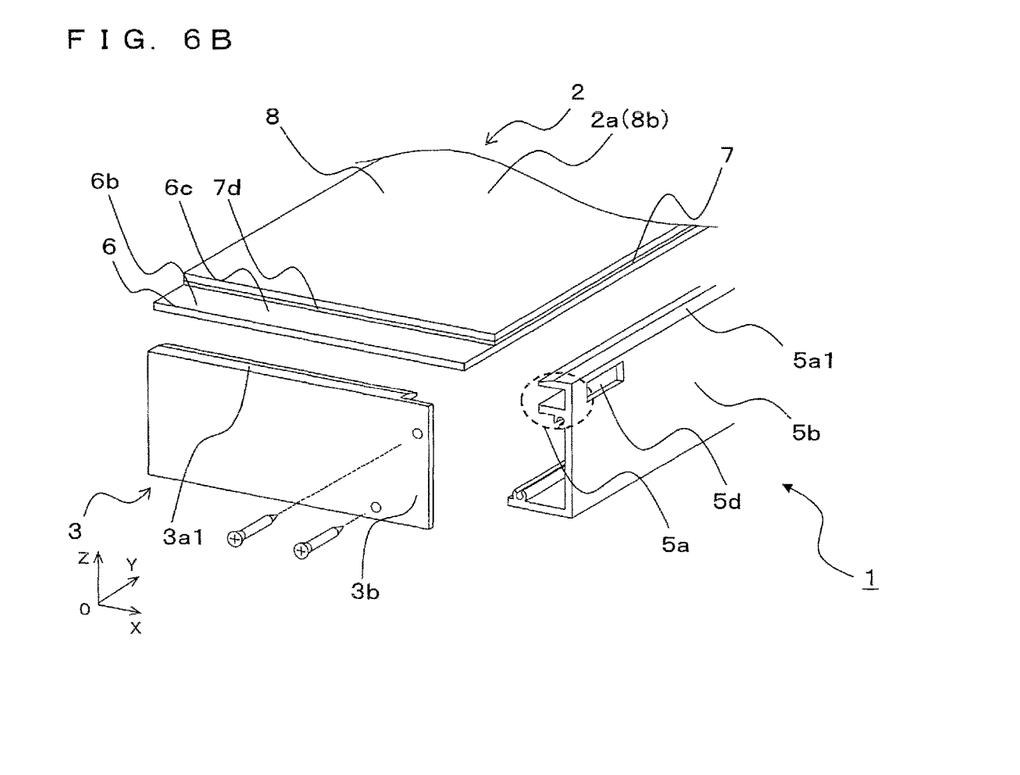
FIG. 6B is an exploded perspective view of the solar cell module in FIG. 6A according to Embodiment 2 of the present disclosure.

The structure of the drain outlet 5c is not limited to the groove described above but may be any as long as it allows water to be drained from the first extension portion 6c. As illustrated in FIGS. 6A and 6B, for example, a through hole 5d that penetrates through the third side surface portion 5b located along the end of the first extension portion 6c, from a portion closer to the solar cell panel 2, which is closer to the fourth surface 8b with respect to the second surface 6b of the first extension portion 6c, to the opposite side of the portion can be used as another drain structure. Specifically, the through hole 5d penetrates through the third side surface portion 5b located along the end of the first extension portion 6c in a direction (X-axis direction) orthogonal to both of an extension direction of the third side surface portion 5b (Y-axis direction) and the laminating direction (Z-axis direction). Water may be drained from this through hole 5d according to Embodiment 2. The through hole 5d may be provided to be opened in the +Z direction of the third portion 5a1.

Embodiment 3

Figure 7:
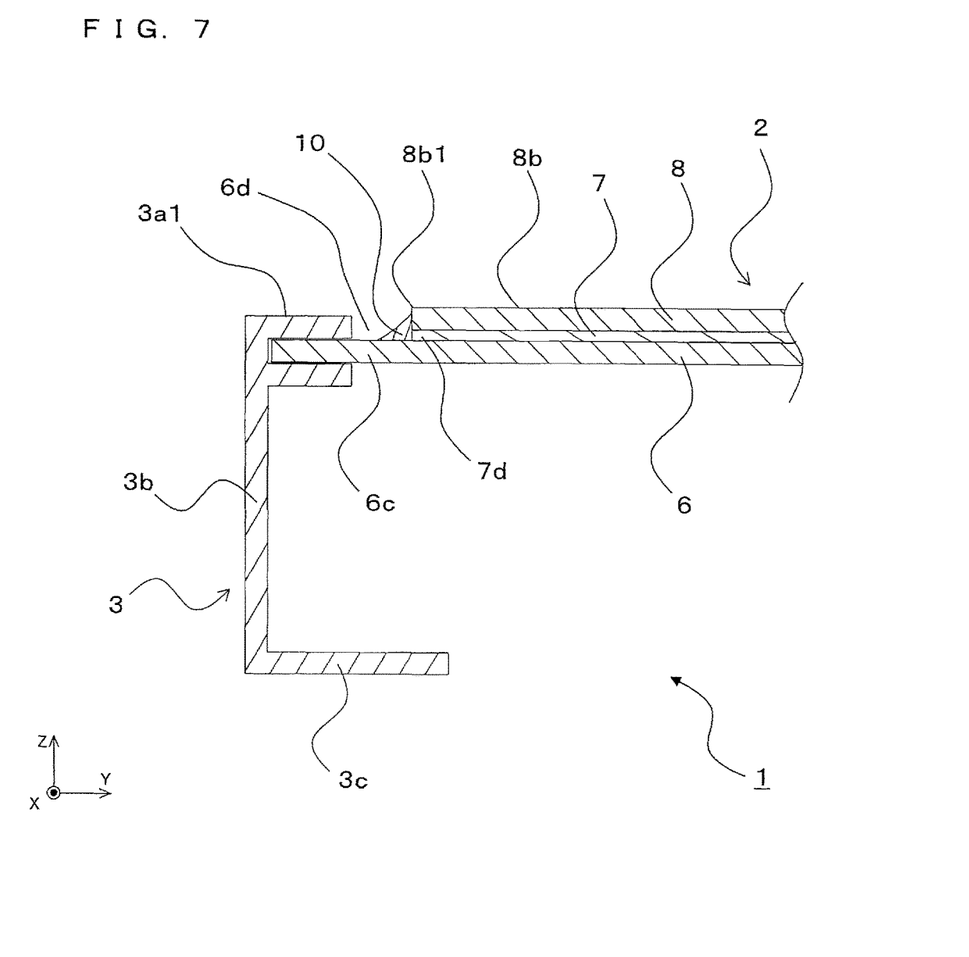
FIG. 7 is an enlarged cross-section view of a part of a solar cell module according to Embodiment 3 of the present disclosure in the vicinity of the first extension portion of FIG. 3A.

As illustrated in FIG. 7, Embodiment 3 differs from each of the other Embodiments in including a water repellent 10 that covers the second end 7d of the photoelectric convertor 7 that is exposed at the groove 6d between the first holder 3a of the first frame 3 and the second substrate 8 and the photoelectric convertor 7. Such water repellent 10 can be made of a filler, for example, a silicone resin.

Accordingly, the sealing material 7c is hardly in contact with the rainwater that builds up in the groove 6d according to Embodiment 3. Accordingly, since the moisture absorbed by the sealing material 7c can be reduced, degradation of the photoelectric convertor 7 caused by yellowing of the sealing material 7c or acids yielded by hydrolysis thereof can be reduced according to Embodiment 3. As a result, decrease in the power generation efficiency subject to the degradation can be reduced according to Embodiment 3.

Embodiment 4

Figure 8:
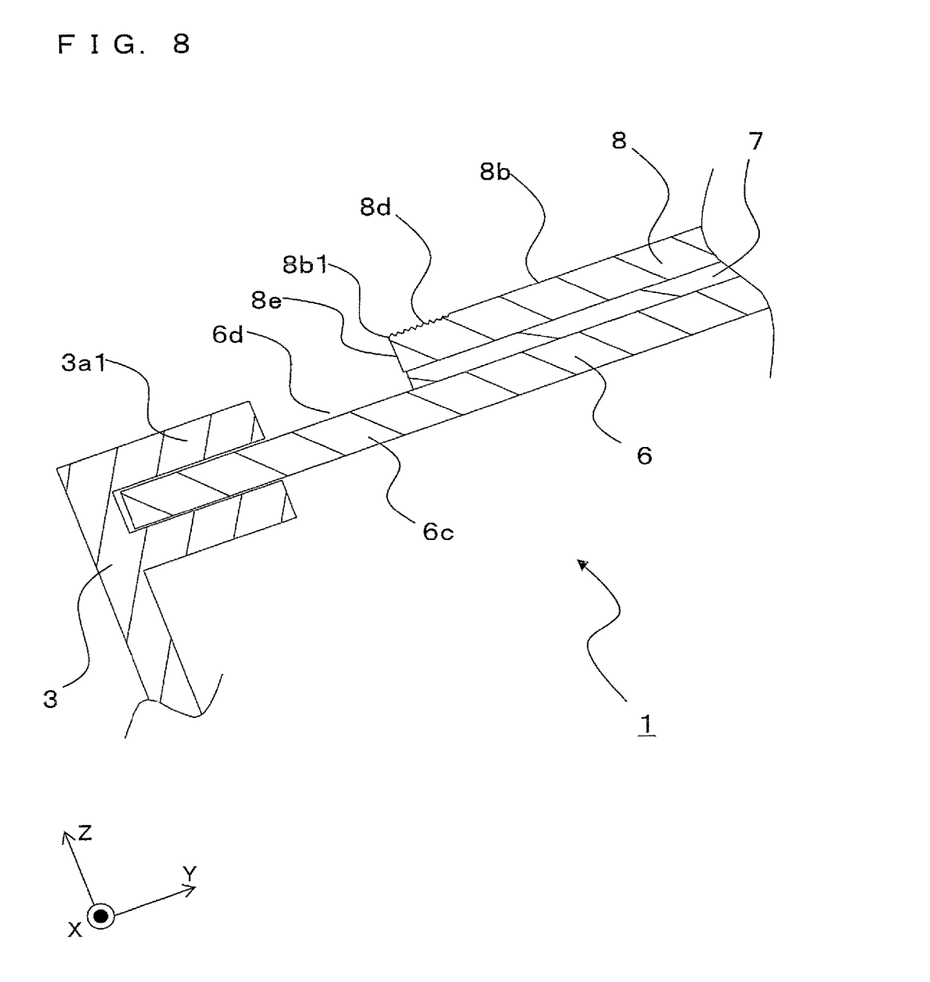
FIG. 8 is an enlarged cross-section view of a part of a solar cell module according to Embodiment 4 of the present disclosure in the vicinity of the first extension portion of FIG. 3A.

As illustrated in FIG. 8, Embodiment 4 differs from each of the other Embodiments in including a first rough portion 8d on the fourth surface 8b closer to the first end 8b1. The first rough portion 8d is a rougher part on the fourth surface 8b closer to the first end 8b1 than the other portions according to Embodiment 4. Furthermore, a side surface between the third surface 8a and the fourth surface 8b is a fifth surface 8e in Embodiment 4. This fifth surface 8e corresponds to a side surface of the second substrate 8 at the first B-side 28c thereof.

The first rough portion 8d can be formed by abrasive blasting a portion of the fourth surface 8b closer to the first end 8b1 using an abrasive such as alumina. The first rough portion 8d may be provided so as not to cut off the light incident from the first end 8b1 on the solar cells 7a as much as possible. The first rough portion 8d may be, for example, 2 to 5 mm long from the first end 8b1. Furthermore, the first rough portion 8d may have a 10-point average roughness ranging from 1 to 10 µm as the surface roughness. Accordingly, the wettability of the first rough portion 8d can be increased. The surface roughness of the first rough portion 8d can be measured by, for example, a surface roughness measuring instrument.

Provision of the first rough portion 8d at the first end 8b1 increases the wettability thereof according to Embodiment 4. Thus, water droplets and others falling on the fourth surface 8b hardly build up by surface tension at a corner between the fourth surface 8b and the fifth surface 8e. As a result, water can be efficiently drained toward the groove 6d according to Embodiment 4. Accordingly, the dirt adhered by evaporation of the water droplets at the first end 8b1 can be further reduced. Accordingly, decrease in the light transmittance on a light receiving surface of the solar cell panel 2 can be reduced, and the power generation efficiency of the solar cell modules 1 can be maintained.

Embodiment 5

Figure 9:
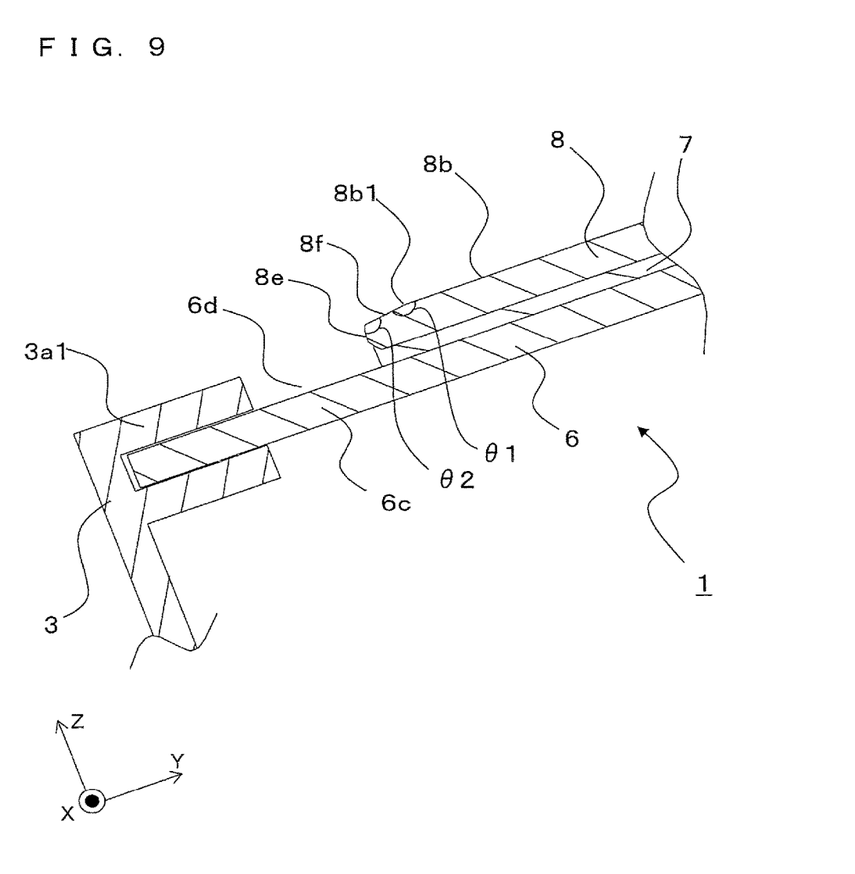
FIG. 9 is an enlarged cross-section view of a part of a solar cell module according to Embodiment 5 of the present disclosure in the vicinity of the first extension portion of FIG. 3A.

As illustrated in FIG. 9, Embodiment 5 differs from each of the other Embodiments in including a sixth surface 8f inclined toward the first extension portion 6c, at the end of the fourth surface 8b closer to the first extension portion 6c.

This sixth surface 8f is an inclined surface continuous from the fourth surface 8b to the fifth surface 8e. The sixth surface 8f can be formed by, for example, grinding or polishing the first end 8b1 of the second substrate 8. The sixth surface 8f may be, for example, 3 to 5 mm long. Furthermore, an angle $\theta 1$ between the fourth surface 8b and the sixth surface 8f may be larger than or equal to 160° and smaller than 180°. Furthermore, an angle $\theta 2$ between the fifth surface 8e and the sixth surface 8f may be as large as the angle $\theta 1$.

Since the difference in inclined angle between the angles $\theta 1$ and $\theta 2$ is smaller than that when the fourth surface 8b and the fifth surface 8e form a right angle, water droplets falling on the fourth surface 8b hardly build up by surface tension at the corners between the fourth surface 8b and the sixth surface 8f and between the sixth surface 8f and the fifth surface 8e according to Embodiment 5. As a result, water can be efficiently drained toward the groove 6d according to Embodiment 5. Accordingly, the dirt adhered by evaporation of the water droplets at the first end 8b1 can be further reduced. Accordingly, decrease in the light transmittance on the light receiving surface of the solar cell panel 2 can be reduced, and the power generation efficiency of the solar cell modules 1 can be maintained.

The fifth surface 8e is not limited to a plane but may be a curve as illustrated in FIG. 9 according to Embodiment 5. Since the angle at the corner between the fifth surface 8e and the sixth surface 8f can be closer to 180° with such a shape, water can be easily drained and the strength at the corner of the second substrate 8 can be increased.

Figure 10:
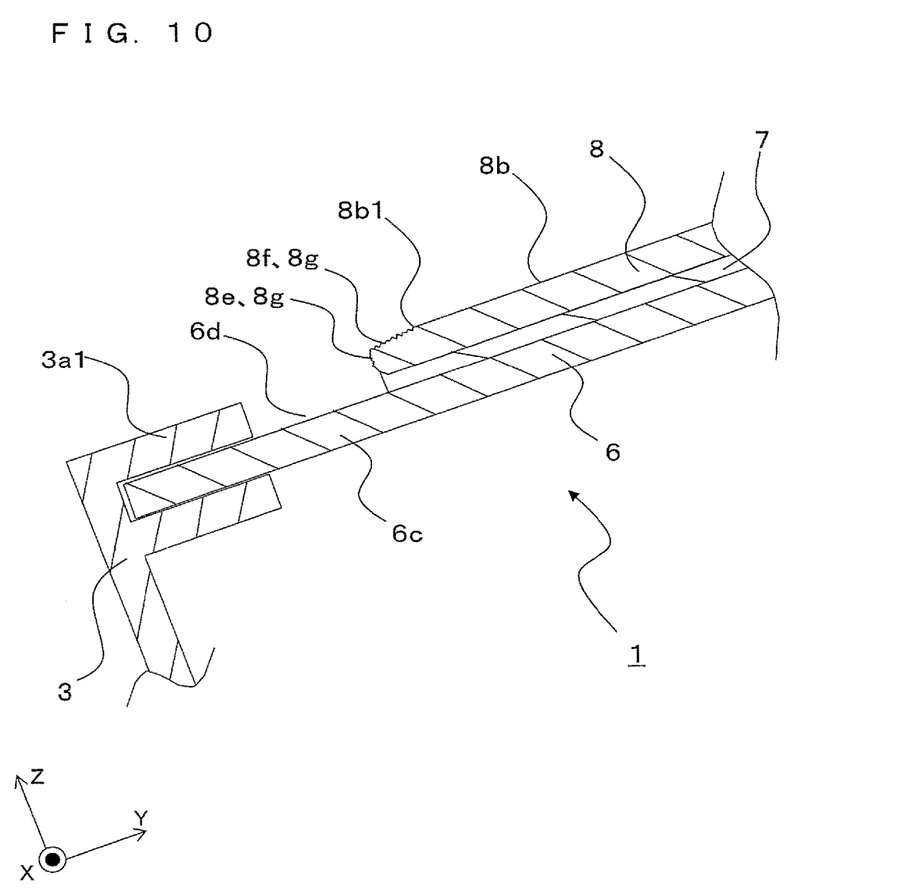
FIG. 10 is an enlarged cross-section view of a solar cell module according to another embodiment of the present disclosure in the vicinity of the first extension portion of FIG. 3A.

Although Embodiments 1 to 5 according to the present disclosure have been exemplified, the present disclosure is not limited to these Embodiments, and may be any as long as it does not depart from the object thereof. As illustrated in FIG. 10, the fifth surface 8e and the sixth surface 8f may include, for example, respective second rough portions 8g whose surfaces have been roughened. Accordingly, since the wettability of the fifth surface 8e and the sixth surface 8f can be increased, water can be more efficiently drained to the groove 6d.

What is claimed is:

1. A solar cell module attached to a framework, the solar cell module comprising:
    a solar cell panel including
        i) a first substrate that is rectangular and includes a first extension portion, a first surface, a second surface opposite the first surface, a first A-side and a second A-side opposite the first A-side,
        ii) a second substrate that is rectangular and includes a second extension portion, a third surface facing the second surface of the first substrate, a fourth surface opposite the third surface, a first B-side and a second B-side opposite the first B-side; and
        iii) a photoelectric convertor arranged between the second surface of the first substrate and the third surface of the second substrate;
    a first frame including a first fixing portion; and
    a second frame including a second fixing portion;
    wherein the first fixing portion fixes an end of the first extension portion of the first substrate,
    the second fixing portion fixes an end of the second extension portion of the second substrate,
        the first B-side is located closer to the first A-side than the second B-side and the second B-side is located closer to the second A-side than the first B-side,
        in a plan perspective view of the solar cell module from the fourth surface, the first extension portion is located more outside than the first B-side with respect to the second substrate in a first direction from the second A-side to the first A-side, and the second extension portion is located more outside than the second A-side with respect to the first substrate in a second direction from the first A-side to the second A-side, and
    the first fixing portion of the first frame forms a groove with the second substrate and the photoelectric converter,
    wherein the groove is configured to allow water flowing from the fourth surface to fall directly on the second surface of the first extension portion and drain outside the solar cell module.

2. The solar cell module according to claim 1, wherein the first fixing portion includes a first portion that covers a part of the second surface of the first extension portion, and
    a level of a top surface of the first portion that is opposite to the second surface is between a level of a top of a part of the second surface of the first extension portion and a level of a top of the fourth surface at the first B-side of the second substrate.

3. The solar cell module according to claim 2, wherein the first portion is thinner than a total thickness of the second substrate and the photoelectric convertor.

4. The solar cell module according to claim 1, wherein the first frame includes a first supporting portion between the first fixing portion and the framework, and a first protruding portion protruding from the first supporting portion along the framework,
    the second fixing portion includes a second portion that covers a part of the fourth surface of the second extension portion,
    the second frame includes a second supporting portion between the second fixing portion and the framework, and a second protruding portion protruding from the second supporting portion along the framework, and
    a surface of the first protruding portion is flush with a surface of the second protruding portion.

5. The solar cell module according to claim 1, wherein the second frame forms a space between the second fixing portion and both the first substrate and the photoelectric converter,
    the solar cell module further comprising a box housing a part of a lead portion electrically connected to the photoelectric convertor, the box being arranged on the third surface facing the space, and
    wherein the box is in direct contact with the third surface facing the space.

6. The solar cell module according to claim 1, wherein the first substrate has a third A-side between the first A-side and the second A-side, and
    the second substrate has a third B-side between the first B-side and the second B-side,
    the solar cell module further comprising a third frame including a third fixing portion that fixes the third A-side of the first substrate and the third B-side of the second substrate.

7. The solar cell module according to claim 6, wherein the third fixing portion includes a third portion that covers a part of the fourth surface, and a side surface portion that is continuous from the third portion and covers side surfaces of the first substrate and the second substrate along a portion of the solar cell panel from the first A-side to the second B-side, and
    the third portion and the side surface portion that are along the end of the first extension portion have a notch extending from a portion closer to the fourth surface than the second surface to a portion flush with the second surface of the first extension portion.

8. The solar cell module according to claim 6, wherein the third fixing portion includes a third portion that covers a part of the fourth surface, and a side surface portion that is continuous from the third portion and covers side surfaces of the first substrate and the second substrate along a portion of the solar cell panel from the first A-side to the second B-side, and
    the side surface portion along the end of the first extension portion has a through hole, the through hole penetrating through the side surface portion, the through hole being closer to the fourth surface than the second surface of the first extension portion.

9. The solar cell module according to claim 1, further comprising a water repellent that covers an end of the photoelectric convertor at the groove.

10. The solar cell module according to claim 1, wherein the first fixing portion includes a first portion that covers a part of the second surface of the first extension portion, and
    a side surface of a second substrate side of the first portion faces the groove and the first B-side of the second substrate faces the groove.

* * * * *